United States Patent
Kang et al.

(10) Patent No.: US 10,020,202 B2
(45) Date of Patent: Jul. 10, 2018

(54) FABRICATION OF MULTI THRESHOLD-VOLTAGE DEVICES

(71) Applicant: GLOBALFOUNDRIES Inc., Grand Cayman (KY)

(72) Inventors: Donghun Kang, Niskayuna, NY (US); Balaji Kannan, Clifton Park, NY (US); Jinping Liu, Ballston Lake, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 117 days.

(21) Appl. No.: 15/099,641

(22) Filed: Apr. 15, 2016

(65) Prior Publication Data

US 2017/0301551 A1 Oct. 19, 2017

(51) Int. Cl.
| | |
|---|---|
| *H01L 21/308* | (2006.01) |
| *H01L 27/092* | (2006.01) |
| *H01L 21/3065* | (2006.01) |
| *H01L 21/285* | (2006.01) |
| *H01L 21/306* | (2006.01) |

(52) U.S. Cl.
CPC .... *H01L 21/3085* (2013.01); *H01L 21/28556* (2013.01); *H01L 21/3065* (2013.01); *H01L 21/30604* (2013.01); *H01L 27/092* (2013.01)

(58) Field of Classification Search
CPC ........... H01L 21/3085; H01L 21/30604; H01L 21/3065; H01L 27/092; H01L 21/28556
See application file for complete search history.

(56) References Cited

U.S. PATENT DOCUMENTS

| | | |
|---|---|---|
| 6,235,596 B1 | 5/2001 | Liao |
| 6,287,920 B1 | 9/2001 | Chatterjee et al. |
| 6,797,553 B2 | 9/2004 | Adkisson et al. |
| 9,041,082 B2 | 5/2015 | Dubourdieu et al. |
| 9,620,610 B1* | 4/2017 | Jangjian ............ H01L 21/82382 |
| 2014/0077281 A1* | 3/2014 | Won ................ H01L 21/823842 257/288 |
| 2016/0049491 A1* | 2/2016 | Lin ..................... H01L 29/4966 257/410 |
| 2016/0268259 A1* | 9/2016 | Chang ................. H01L 27/0922 |

* cited by examiner

*Primary Examiner* — Steven Loke
*Assistant Examiner* — Juanita Rhodes
(74) *Attorney, Agent, or Firm* — Ditthavong & Steiner, P.C.

(57) ABSTRACT

A method of fabricating multi $V_{th}$ devices and the resulting device are disclosed. Embodiments include forming a high-k dielectric layer over a substrate; forming a first TiN layer, a first barrier layer, a second TiN layer, a second barrier layer, and a third TiN layer consecutively over the high-k dielectric layer; forming a first masking layer over the third TiN layer in a first region; removing the third TiN layer in second and third regions, exposing the second barrier layer in the second and third regions; removing the first masking layer; removing the exposed second barrier layer; forming a second masking layer over the third TiN layer in the first region and the second TiN layer in the second region; removing the second TiN layer in the third region, exposing the first barrier layer in the third region; removing the second masking layer; and removing the exposed first barrier layer.

20 Claims, 11 Drawing Sheets

US 10,020,202 B2

FABRICATION OF MULTI THRESHOLD-VOLTAGE DEVICES

TECHNICAL FIELD

The present disclosure relates to the manufacture of semiconductor devices, such as integrated circuits (ICs). The present disclosure is particularly applicable to forming a multi threshold-voltage ($V_{th}$) device for 14 nanometer (nm) and 10 nm technology nodes and beyond.

BACKGROUND

In a fabrication of semiconductor devices, IC designs and resulting devices may need to support p-type and n-type devices having multi $V_{th}$. Typical methods for forming multi $V_{th}$ devices include depositing, patterning, etching, removing and re-depositing titanium nitride (TiN) multiple times. However, this process is highly complex, and results in damage at the TiN and high-k dielectric interface, since the TiN is etched all the way down to the high-k dielectric layer, thereby exposing the high-k dielectric layer to the etchants.

A need therefore exists for methodology enabling formation of plural TiN thicknesses without damaging an underlying high-k dielectric layer and the resulting device.

SUMMARY

An aspect of the present disclosure is a method of forming a multi $V_{th}$ device including forming barrier layers between TiN layers to allow etching of one TiN layer at a time.

Another aspect of the present disclosure is a multi $V_{th}$ device including barrier layers between TiN layers.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a high-k dielectric layer over a substrate; forming a first TiN layer, a first barrier layer, a second TiN layer, a second barrier layer, and a third TiN layer consecutively over the high-k dielectric layer; forming a first masking layer over the third TiN layer in a first region; removing the third TiN layer in second and third regions, exposing the second barrier layer in the second and third regions; removing the first masking layer; removing the exposed second barrier layer; forming a second masking layer over the third TiN layer in the first region and the second TiN layer in the second region; removing the second TiN layer in the third region, exposing the first barrier layer in the third region; removing the second masking layer; and removing the exposed first barrier layer.

Aspects of the present disclosure include depositing tungsten (W) over the first, second, and third TiN layers subsequent to removing the exposed first barrier layer, for a p-type device. Another aspects include forming an n-type work-function (WF) metal layer over first, second, and third TiN layers subsequent to removing the exposed first barrier layer; and depositing W over the n-type WF metal layer, for an n-type device. Other aspects include depositing the TiN and barrier layers by chemical vapor deposition (CVD), atomic layer deposition (ALD), or physical vapor deposition (PVD) with no air break between layers. Additional aspects include the first barrier layer and the second barrier layer including titanium silicide nitride (TiSiN) or lanthanum nitride (LaN). Another aspect includes the first barrier layer and the second barrier layer including tantalum nitride (TaN). Further aspects include removing the third TiN layer in the second and third regions and the second TiN layer in the third region by etching. Another aspect includes removing the first and second barrier layers by etching selective to TiN. Other aspects include etching the first barrier layer by a wet etch or reactive ion etching (RIE). A further aspect includes etching the second barrier layer by a wet etch. Another aspect includes removing the first and second masking layers by ashing. Other aspects include forming the barrier layer to a thickness of 5 angstroms (Å) to 20 Å.

Another aspect of the present disclosure is a device including: a high-k dielectric layer over a substrate; a first TiN layer over the high-k dielectric layer in first, second, and third regions; a first barrier layer over the first TiN layer in the second and third regions; a second TiN layer over the first barrier layer; a second barrier layer over the second TiN layer in the third region; and a third TiN layer over the second barrier layer.

Aspects of the device include the W over the first, second, and third TiN layers, for a p-type device. Other aspects include an n-type WF metal layer over first, second, and third TiN layers; and W over the n-type WF metal layer, for an n-type device. Another aspect includes depositing the TiN and barrier layers by CVD, ALD, or PVD with no air break between layers. Further aspects include the first barrier layer and the second barrier layer including TiSiN and LaN. A further aspect include the first barrier layer and the second barrier layer including TaN. Another aspect includes the barrier layer having a thickness of 5 Å to 20 Å.

Another aspect of the present disclosure is a method including: forming a high-k dielectric layer over a substrate; forming a first TiN layer over the high-k dielectric layer to a thickness of 5 Å to 20 Å; forming over the first TiN layer a first barrier layer including TiSiN or TaN or LaN to a thickness of 5 Å to 20 Å; forming a second TiN layer over the first barrier layer to a thickness of 5 Å to 20 Å; forming over the second TiN layer a second barrier layer including TiSiN or TaN or LaN to a thickness of 5 Å to 20 Å; forming a third TiN layer over the second barrier layer to a thickness of 5 Å to 20 Å; forming a first masking layer over the third TiN layer in a first region; etching the third TiN layer in second and third regions, exposing the second barrier layer in the second and third regions; removing the first masking layer by ashing; etching the exposed second barrier layer selective to TiN; forming a second masking layer over the third TiN layer in the first region and the second TiN layer in the second regions; etching the second TiN layer in the third region, exposing the first barrier layer in the third region; removing the second masking layer by ashing; etching the exposed first barrier layer selective to TiN; depositing W over the first, second, and third TiN layers subsequent to removing the exposed first barrier layer, for a p-type device; and forming an n-type WF metal layer over first, second, and third TiN layers subsequent to removing the exposed first barrier layer and depositing W over the n-type WF metal layer, for an n-type device.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
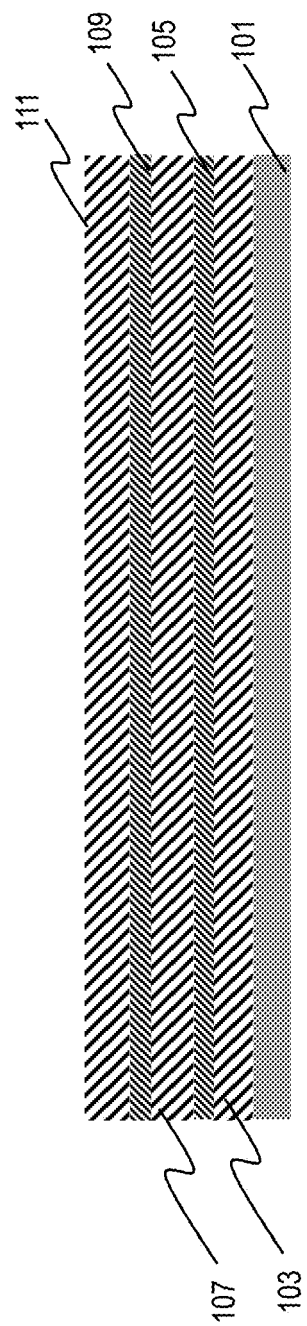
FIGS. 1A through 1K schematically illustrate sequential steps of a method of forming multi $V_{th}$ devices, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, wellknown structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of a damaged TiN to high-k dielectric interface attendant upon chemical attack from repeated removal and replacement of the TiN layer to form a multi $V_{th}$ device. In accordance with embodiments of the present disclosure, a multi-stack of alternating barrier layers and TiN layers is formed over the high-k dielectric layer by using a clustered tool. Then, different portions of the multi-stack are etched down to different barrier layers to obtain desired thicknesses to meet the device $V_{th}$ requirements.

Methodology in accordance with embodiments of the present disclosure includes forming a high-k dielectric layer (e.g., lanthanum oxide ($LaO_2$)) over a substrate. Next, a first TiN layer, a first barrier layer, a second TiN layer, a second barrier layer, and a third TiN layer are formed consecutively over the high-k dielectric layer. Then, a first masking layer is formed over the third TiN layer in a first region, and the third TiN layer is removed in second and third regions, exposing the second barrier layer in the second and third regions. Next, the first masking layer is removed. Then, the exposed second barrier layer is removed. Subsequently, a second masking layer is formed over the third TiN layer in the first region and the second TiN layer in the second regions. Then, the second TiN layer in the third region is removed, exposing the first barrier layer in the third region. Next, the second masking layer is removed. Finally, the exposed first barrier layer is removed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 1K schematically illustrate sequential steps of a method of forming multi $V_{th}$ devices including barrier layers between TiN layers for reduced etching of TiN layers, in accordance with an exemplary embodiment. Adverting to FIG. 1A, a high-k dielectric layer 101 is formed over a substrate, such as a silicon wafer (not shown for illustrative convenience). The high-k dielectric may include materials with dipole formation materials such as $LaO_2$. Next, a first TiN layer 103, a first barrier layer 105, a second TiN layer 107, a second barrier layer 109, and a third TiN layer 111 are consecutively deposited over the high-k dielectric layer 101 in three regions for each device to be formed (a first region where a thick TiN layer is required, a second region where a thinner TiN layer is needed, and a third region where a thin TiN is required). These layers may be deposited with an air break or without an air break with CVD, ALD or PVD. The high-k dielectric layer 101 is formed to a thickness of 5 Å to 20 Å. The first TiN layer 103, the second TiN layer 107 and the third TiN layer 111 are each formed to a thickness of 5 Å to 20 Å. The first barrier layer 105 and the second barrier layer 109 are each formed of TiSiN or TaN or LaN, and are each deposited to a thickness of 5 Å to 20 Å. The TiN and barrier layers may all be deposited in a clustered tool.

Figure 1B:
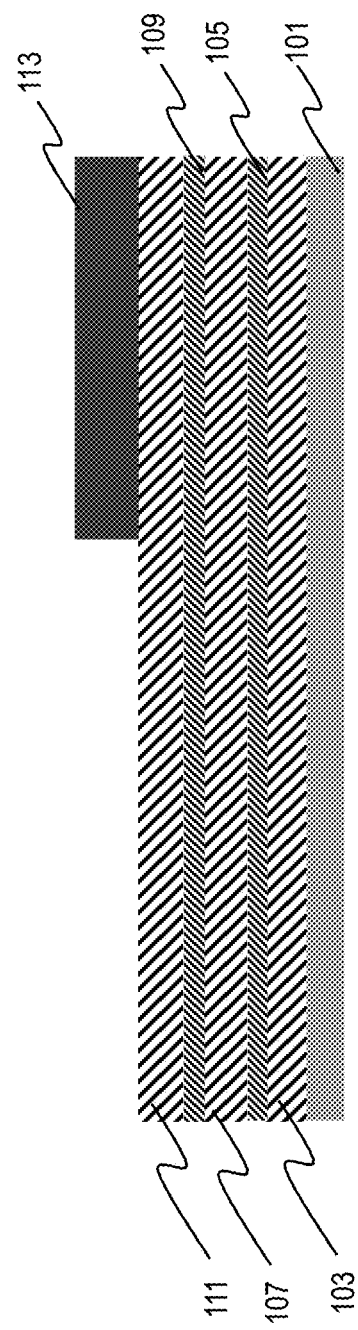
Figure 1C:
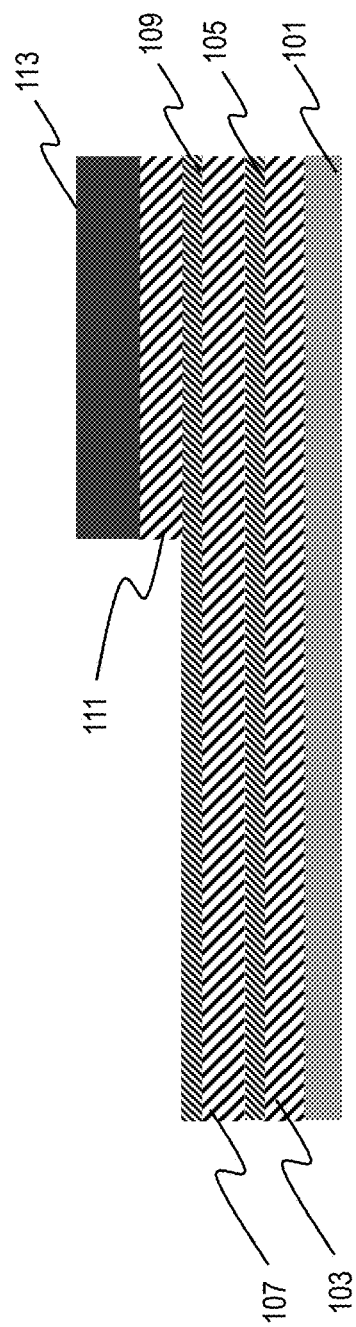
Figure 1D:
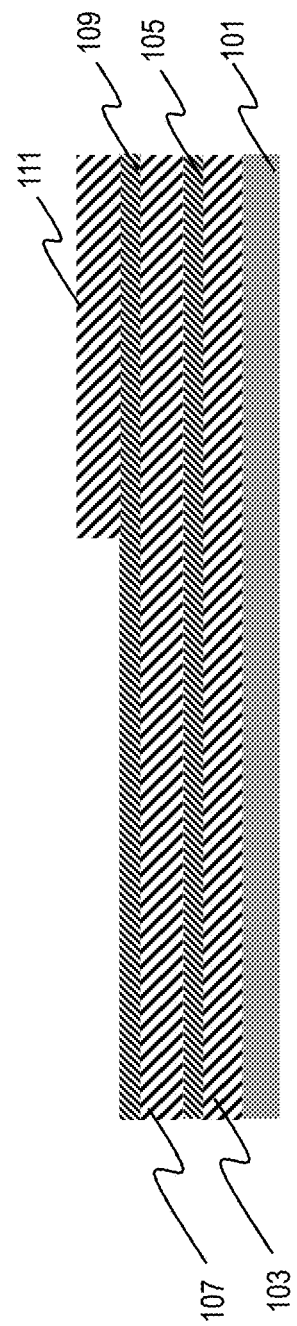
Figure 1E:
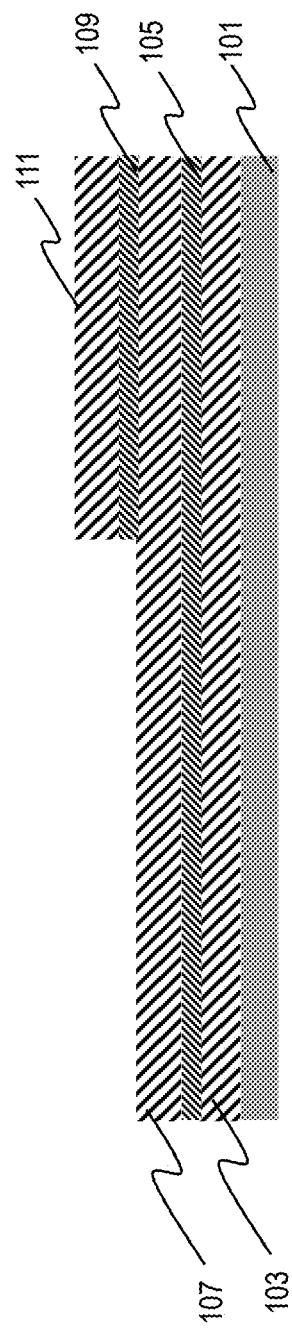

Adverting to FIG. 1B, a masking layer 113 is formed over an upper surface of the third TiN layer 111 in a first region. The masking layer 113 may be formed of silicon oxide or photoresist. Next, as illustrated in FIG. 1C, the third TiN layer 111 is removed in the second and third regions by etching, thereby exposing the second barrier layer 109 in the second and third regions. The TiN layer may be etched by RIE or by a wet etch process. Then, the first masking layer 113 is removed by ashing, for example with diazene ($N_2H_2$) plasma, as depicted in FIG. 1D. Subsequently, as illustrated in FIG. 1E, the exposed second barrier layer 109 is removed by RIE or a wet etch selective to TiN, thereby exposing the second TiN layer 107 in the second and third regions. A wet etching may use an etching solution of SC1, or a dry etching may use $Cl_2$/He, HCl/He, $Cl_2$/He+$O_2$, CF4/N2, or Cl2/H2/Ar.

Figure 1F:
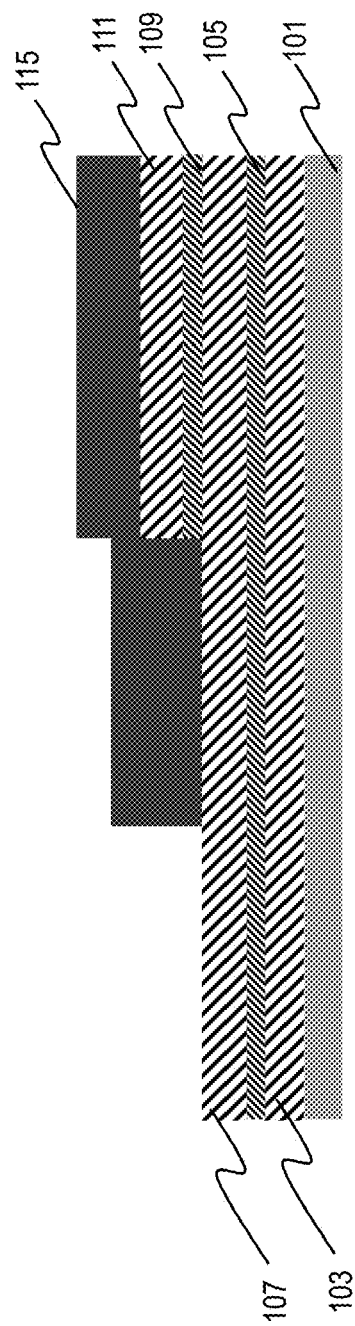
Figure 1G:
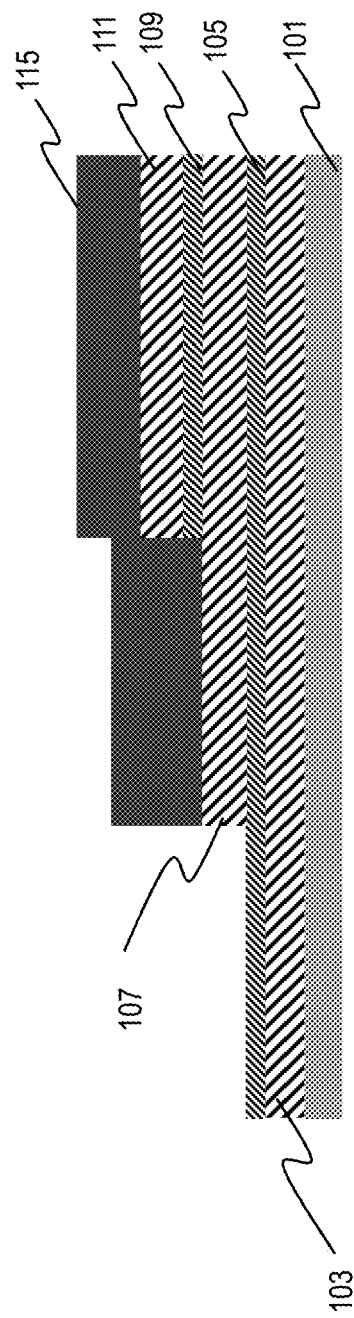
Figure 1H:
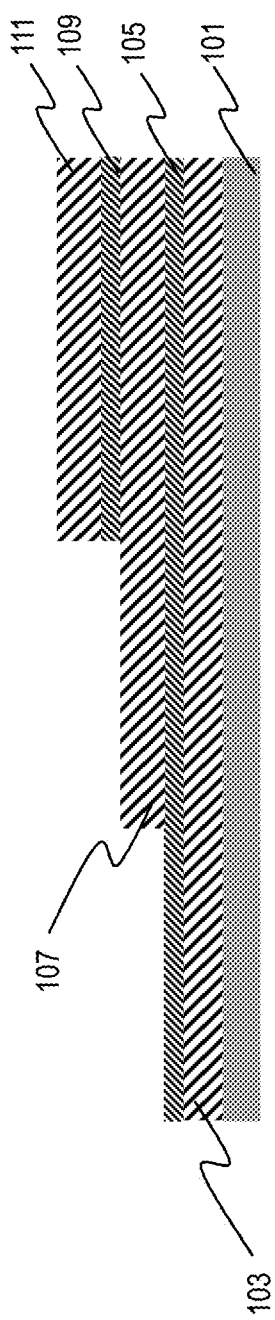
Figure 1I:
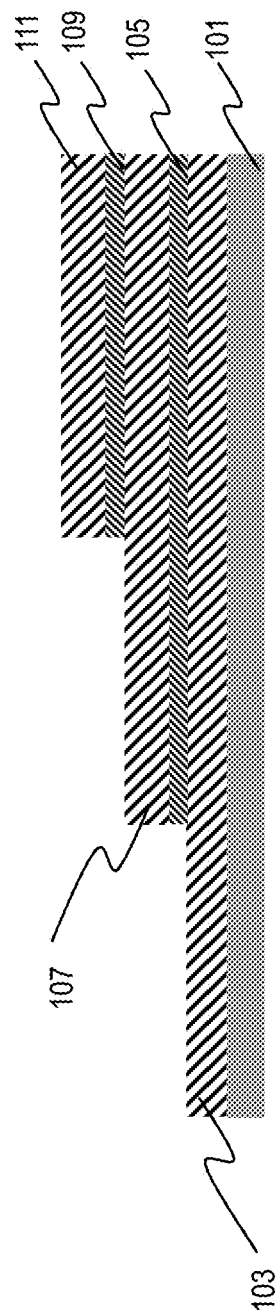

Adverting to FIG. 1F, a second masking layer 115 is formed over the third TiN layer 111 in the first region and the second TiN layer 109 in the second region. The masking layer 115, like masking layer 113, is formed of silicon oxide or photoresist. Next, as illustrated in FIG. 1G, the second TiN layer 107 is removed in the third region by etching, thereby exposing the first barrier layer 105 in the third region. Then, the masking layer 115 is removed by ashing, as depicted in FIG. 1H. Subsequently, as illustrated in FIG. 1I, the exposed first barrier layer 105 is removed by a wet etch or RIE selective to TiN, thereby exposing the first TiN layer 103 in the third region.

Figure 1J:
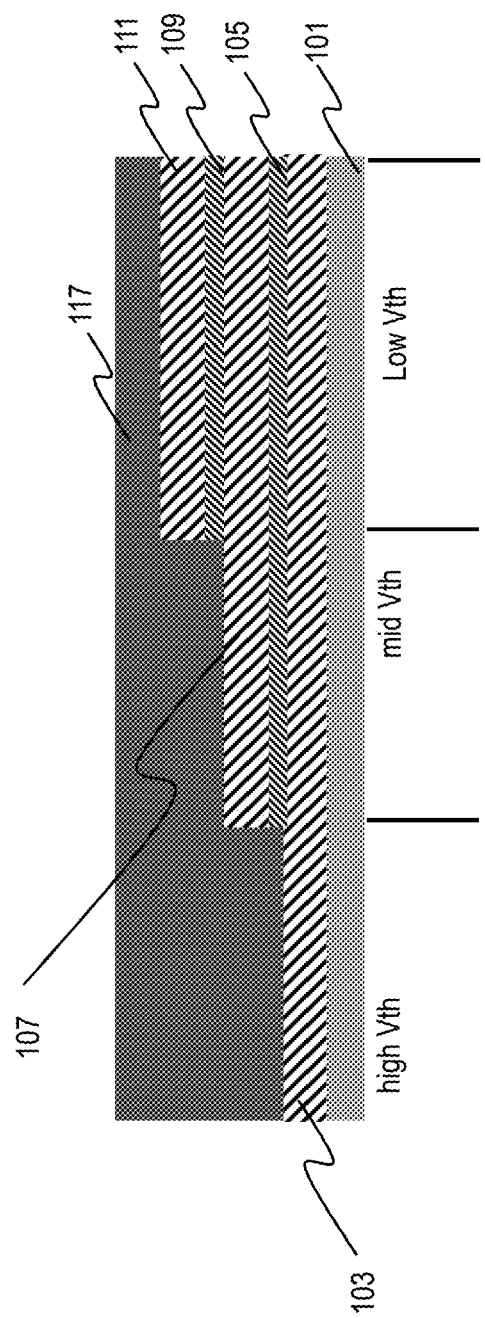

As illustrated in FIG. 1J, subsequent to removing the exposed first barrier layer 105, W 117 is deposited over the first TiN layer 103, second TiN layer 107, and third TiN layer 111 for a p-type device. The resulting device has a thin TiN layer for a high $V_{th}$, a thick TiN for a low $V_{th}$, and a medium thickness TiN for a middle $V_{th}$.

Figure 1K:
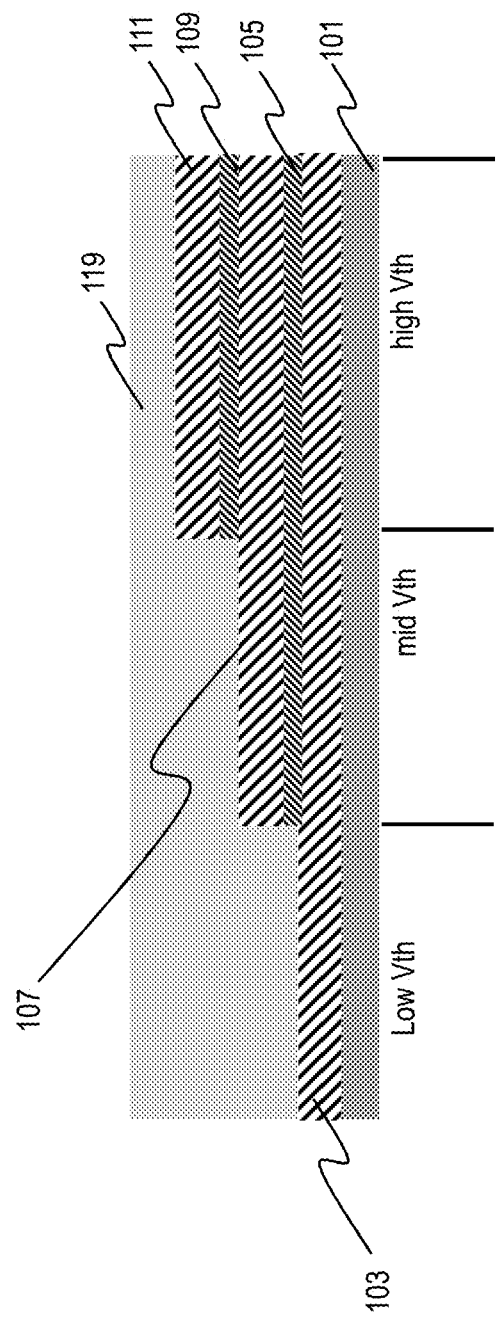

Alternatively, for an n-type device, subsequent to removing the exposed first barrier layer 105, an n-type WF metal layer 119 is formed over the first TiN layer 103, the second TiN layer 107, and the third TiN layer 111, as illustrated in FIG. 1K. The n-type WF metal layer may be formed, for example, of titanium carbide (TiC). Then, W is deposited over the n-type WF metal layer to complete the n-type device. The resulting device includes a thin TiN layer for a low $V_{th}$, a thick TiN for a high $V_{th}$, and a medium thickness TiN for a middle $V_{th}$.

The embodiments of the present disclosure can achieve several technical effects, such as, the TiN to high-k dielectric interface. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated IC devices, particularly for the 14 nm and 10 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a high-k dielectric layer over a substrate;
   forming a first titanium nitride (TiN) layer, a first barrier layer, a second TiN layer, a second barrier layer, and a third TiN layer consecutively over the high-k dielectric layer;
   forming a first masking layer over the third TiN layer in a first region;
   removing the third TiN layer in second and third regions, exposing the second barrier layer in the second and third regions;
   removing the first masking layer;
   removing the exposed second barrier layer;
   forming a second masking layer over the third TiN layer in the first region and the second TiN layer in the second region;
   removing the second TiN layer in the third region, exposing the first barrier layer in the third region;
   removing the second masking layer; and
   removing the exposed first barrier layer.

2. The method according to claim 1, further comprising:
   depositing tungsten (W) over the first, second, and third TiN layers subsequent to removing the exposed first barrier layer, for a p-type device.

3. The method according to claim 1, further comprising:
   forming an n-type work-function (WF) metal layer over first, second, and third TiN layers subsequent to removing the exposed first barrier layer; and
   depositing W over the n-type WF metal layer, for an n-type device.

4. The method according to claim 1, comprising:
   depositing the first, second and third TiN and the first and second barrier layers by chemical vapor deposition (CVD), atomic layer deposition (ALD), or physical vapor deposition (PVD) with no air break between each subsequent first, second, and third TiN layers and first and second barrier layers, respectively.

5. The method according to claim 1, wherein the first barrier layer and the second barrier layer comprise titanium silicide nitride (TiSiN).

6. The method according to claim 1, wherein the first barrier layer and the second barrier layer comprise tantalum nitride (TaN) or lanthanum nitride (LaN).

7. The method according to claim 1, comprising removing the third TiN layer in the second and third regions and the second TiN layer in the third region by etching.

8. The method according to claim 7, comprising:
   removing the first and second barrier layers by etching selective to TiN.

9. The method according to claim 8, comprising etching the first barrier layer by a wet etch or reactive ion etching (RIE).

10. The method according to claim 8, comprising etching the second barrier layer by a wet etch.

11. The method according to claim 1, comprising removing the first and second masking layers by ashing.

12. The method according to claim 1, comprising forming the first barrier layer and the second barrier layer, respectively, to a thickness of 5 angstroms (Å) to 20 Å.

13. A device comprising:
    a high-k dielectric layer over a substrate;
    a first titanium nitride (TiN) layer over the high-k dielectric layer in first, second, and third regions;
    a first barrier layer over the first TiN layer in the second and third regions;
    a second TiN layer over the first barrier layer;
    a second barrier layer over the second TiN layer in the third region; and
    a third TiN layer over the second barrier layer,
    wherein the third region comprises the first, second and third TiN layers,
    the second region comprises the first and second TiN layers, but not the third TiN layer, and
    the first region comprises the first TiN layer, but not the second or third TiN layers.

14. The device according to claim 13, further comprising:
    tungsten (W) over the first, second, and third TiN layers, for a p-type device.

15. The device according to claim 13, further comprising:
    an n-type work-function (WF) metal layer over first, second, and third TiN layers; and
    tungsten (W) over the n-type WF metal layer, for an n-type device.

16. The device according to claim 15, wherein:
    the n-type work-function (WF) metal layer comprises titanium carbide (TiC).

17. The device according to claim 13, wherein the first barrier layer and the second barrier layer comprise titanium silicide nitride (TiSiN).

18. The device according to claim 13, wherein the first barrier layer and the second barrier layer comprise tantalum nitride (TaN).

19. The device according to claim 13, wherein the first barrier layer has a thickness of 5 angstroms (Å) to 20 Å.

20. A method comprising:
    forming a high-k dielectric layer over a substrate;
    forming a first titanium nitride (TiN) layer over the high-k dielectric layer to a thickness of 5 Å to 20 Å;
    forming over the first TiN layer a first barrier layer comprising titanium silicide nitride (TiSiN) or tantalum nitride (TaN) to a thickness of 5 Å to 20 Å;
    forming a second TiN layer over the first barrier layer to a thickness of 5 Å to 20 Å;
    forming over the second TiN layer a second barrier layer comprising titanium silicide nitride (TiSiN) or tantalum nitride (TaN) to a thickness of 5 Å to 20 Å;

forming a third TiN layer over the second barrier layer to a thickness of 5 Å to 20 Å;

forming a first masking layer over the third TiN layer in a first region;

etching the third TiN layer in second and third regions, exposing the second barrier layer in the second and third regions;

removing the first masking layer by ashing;

etching the exposed second barrier layer selective to TiN;

forming a second masking layer over the third TiN layer in the first region and the second TiN layer in the second region;

etching the second TiN layer in the third region, exposing the first barrier layer in the third region;

removing the second masking layer by ashing;

etching the exposed first barrier layer selective to TiN;

and forming a work-function (WF) metal layer over first, second, and third TiN layers subsequent to removing the exposed first barrier layer and depositing tungsten (W) over the WF metal layer.

* * * * *